US012581007B2

(12) United States Patent
Kang et al.

(10) Patent No.: US 12,581,007 B2
(45) Date of Patent: Mar. 17, 2026

(54) ELECTRONIC DEVICE INCLUDING MULTIPLE PCBS AND ANTENNAS PRINTED ON PCBS

(71) Applicant: Samsung Electronics Co., Ltd.,
Suwon-si (KR)

(72) Inventors: Taejin Kang, Suwon-si (KR); Hyoseok Na, Suwon-si (KR); Jongdoo Kim, Suwon-si (KR); Kyungdae Son, Suwon-si (KR); Jiyoung Jung, Suwon-si (KR); Wanjae Ju, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 358 days.

(21) Appl. No.: 18/338,854

(22) Filed: Jun. 21, 2023

(65) Prior Publication Data
US 2023/0336652 A1 Oct. 19, 2023

Related U.S. Application Data

(63) Continuation of application No. PCT/KR2022/002448, filed on Feb. 18, 2022.

(30) Foreign Application Priority Data

Feb. 18, 2021 (KR) ........................ 10-2021-0021914

(51) Int. Cl.
*H04M 1/00* (2006.01)
*H01Q 1/24* (2006.01)
(Continued)

(52) U.S. Cl.
CPC .......... *H04M 1/0277* (2013.01); *H01Q 1/243* (2013.01); *H01Q 7/06* (2013.01); (Continued)

(58) Field of Classification Search
CPC ............ H04M 1/0277; H04M 2201/38; H01Q 1/243; H01Q 7/06; H01Q 5/40; (Continued)

(56) References Cited

U.S. PATENT DOCUMENTS 8,395,553 B2 3/2013 Oh
10,868,362 B2 12/2020 Yun et al.
(Continued)

FOREIGN PATENT DOCUMENTS

CN 106790802 A 5/2017
CN 108695599 A 10/2018
(Continued)

OTHER PUBLICATIONS

Extended European Search Report dated Apr. 17, 2024, issued in European Patent Application No. 22756562.9.
(Continued)

*Primary Examiner* — Ping Y Hsieh
(74) *Attorney, Agent, or Firm* — Jefferson IP Law, LLP

(57) ABSTRACT

An electronic device is provided. The electronic device includes a housing including a first plate facing a first direction and a second plate facing a second direction opposite to the first direction, and forming a space between the first plate and the second plate, a display disposed inside the housing and exposed through the first plate, a first printed circuit board disposed between the display and the second plate, a second printed circuit board disposed between the display and the second plate, a third printed circuit board which is disposed between the display and the second plate and electrically connects the first printed circuit board and the second printed circuit board, and a first antenna coupled to the first printed circuit board, wherein the third printed circuit board may include a second antenna electrically connected to the first antenna.

20 Claims, 11 Drawing Sheets

(51) Int. Cl.

| | |
|---|---|
| *H01Q 7/06* | (2006.01) |
| *H04M 1/02* | (2006.01) |
| *H05K 1/14* | (2006.01) |
| *H05K 1/16* | (2006.01) |

(52) U.S. Cl.
CPC ............. *H05K 1/142* (2013.01); *H05K 1/147* (2013.01); *H05K 1/16* (2013.01); *H04M 2201/38* (2013.01); *H05K 2201/10098* (2013.01)

(58) Field of Classification Search
CPC ........ H01Q 1/38; H01Q 1/2208; H05K 1/142; H05K 1/147; H05K 1/16; H05K 2201/10098
See application file for complete search history.

(56) References Cited

U.S. PATENT DOCUMENTS

| | | | |
|---|---|---|---|
| 10,923,820 | B2 | 2/2021 | Kang |
| 2011/0037664 | A1 | 2/2011 | Cho et al. |
| 2012/0067961 | A1 | 3/2012 | Mauricia |
| 2020/0021015 | A1* | 1/2020 | Yun ..................... H01Q 1/2283 |
| 2020/0127376 | A1* | 4/2020 | Kang ................... H05K 1/0277 |
| 2021/0036434 | A1 | 2/2021 | Yeom et al. |
| 2021/0159587 | A1* | 5/2021 | Lee ....................... H01Q 1/243 |
| 2023/0155610 | A1 | 5/2023 | Lee et al. |

FOREIGN PATENT DOCUMENTS

| | | | |
|---|---|---|---|
| KR | 10-2005-0040302 | A | 5/2005 |
| KR | 10-0720939 | B1 | 5/2007 |
| KR | 10-2013-0060327 | A | 6/2013 |
| KR | 10-1400623 | B1 | 5/2014 |
| KR | 10-1720329 | B1 | 3/2017 |
| KR | 10-2018-0049668 | A | 5/2018 |
| KR | 10-1958316 | B1 | 3/2019 |
| KR | 10-2020-0007377 | A | 1/2020 |
| KR | 10-2020-0045908 | A | 5/2020 |
| KR | 10-2021-0015563 | A | 2/2021 |
| KR | 10-2021-0017066 | A | 2/2021 |

OTHER PUBLICATIONS

International Search Report dated May 30, 2022, issued in International Application No. PCT/KR2022/002448.
Korean Office Action dated Apr. 12, 2025, issued in Korean Patent Application No. 10-2021-0021914.

* cited by examiner

FIG. 1

ELECTRONIC DEVICE INCLUDING MULTIPLE PCBS AND ANTENNAS PRINTED ON PCBS

CROSS-REFERENCE TO RELATED APPLICATION(S)

This application is a continuation application, claiming priority under § 365(c), of an International application No. PCT/KR2022/002448, filed on Feb. 18, 2022, which is based on and claims the benefit of a Korean patent application number 10-2021-0021914, filed on Feb. 18, 2021, in the Korean Intellectual Property Office, the disclosure of which is incorporated by reference herein in its entirety.

BACKGROUND

1. Field

The disclosure relates to an electronic device including a conductive pattern printed on a printed circuit board (PCB).

2. Description of Related Art

Recently, electronic devices are becoming smaller and thinner. Accordingly, a mounting space inside an electronic device is becoming narrower.

Depending on the presence or absence of flexibility, a printed circuit board may be classified into a flexible printed circuit board (FPCB) manufactured using a flexible material, or a rigid printed circuit board (rigid PCB, (R)PCB).

In general, along with the increase in the distribution rate of portable electronic devices (e.g., smartphones), the direction of utilization has also been developed into various fields, and magnetic secure transmission (MST) technology has attracted attention as an example of such utilization. When the MST technology is applied to an electronic device, the electronic device is capable of being used not only for purposes such as basic functions such as call, video/music playback, and route guidance available in the existing electronic devices, but also for purposes such as payment of a prepaid/postpaid traffic charge, credit card payment, an electronic bankbook, and/or identification.

The above information is presented as background information only to assist with an understanding of the disclosure. No determination has been made, and no assertion is made, as to whether any of the above might be applicable as prior art with regard to the disclosure.

SUMMARY

An antenna for MST wireless communication may be received in an internal space of an electronic device. The greater the inductance of a coil included in the antenna, the greater the strength of magnetic flux, which makes it easy to secure radiation performance. However, the fact that the coil is required to be received in a limited space of the electronic device and the fact that the greater the inductance is, the relatively greater the internal resistance is, which may make the strength of magnetic flux weaker, are becoming limitations in increasing the inductance. In addition, for space utilization, a mounting position of the antenna may be limited to a part of the electronic device. In this case, in the case of an antenna for short-distance wireless communication such as MST communication, a recognition area of the antenna may be limited according to a mounting position of the antenna.

Aspects of the disclosure are to address at least the above-mentioned problems and/or disadvantages and to provide at least the advantages described below. Accordingly, an aspect of the disclosure is to provide an electronic device including a conductive pattern printed on a PCB.

Additional aspects will be set forth in part in the description which follows and, in part, will be apparent from the description, or may be learned by practice of the presented embodiments.

In accordance with an aspect of the disclosure, an electronic device is provided. The electronic device includes a housing which includes a first plate facing a first direction and a second plate facing a second direction opposite to the first direction, and forms a space between the first plate and the second plate, a display disposed inside the housing and exposed through the first plate, a first printed circuit board disposed between the display and the second plate, a second printed circuit board disposed between the display and the second plate, a third printed circuit board which is disposed between the display and the second plate and electrically connects the first printed circuit board and the second printed circuit board, and a first antenna coupled to the first printed circuit board, wherein the third printed circuit board includes a second antenna electrically connected to the first antenna.

According to various embodiments, the performance of an antenna can be improved by expanding a recognition area of the antenna. According to various embodiments, the space efficiency can be provided by increasing the performance of an antenna by using a limited mounting space.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a block diagram of an electronic device in a network environment, according to an embodiment of the disclosure;

Throughout the drawings, it should be noted that like reference numbers are used to depict the same or similar elements, features, and structures.

DETAILED DESCRIPTION

Figure 2:
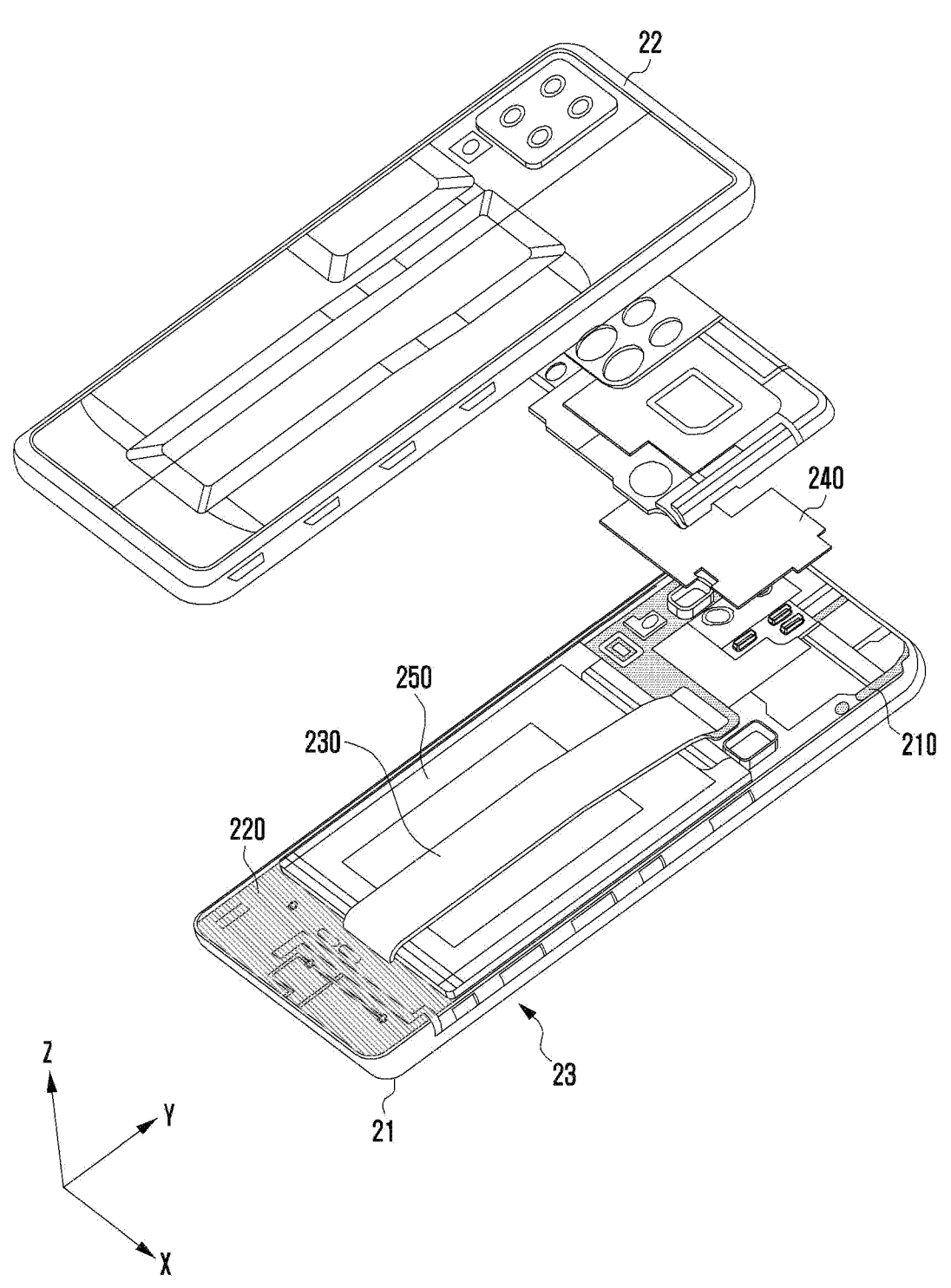
FIG. 2 is an exploded perspective view of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
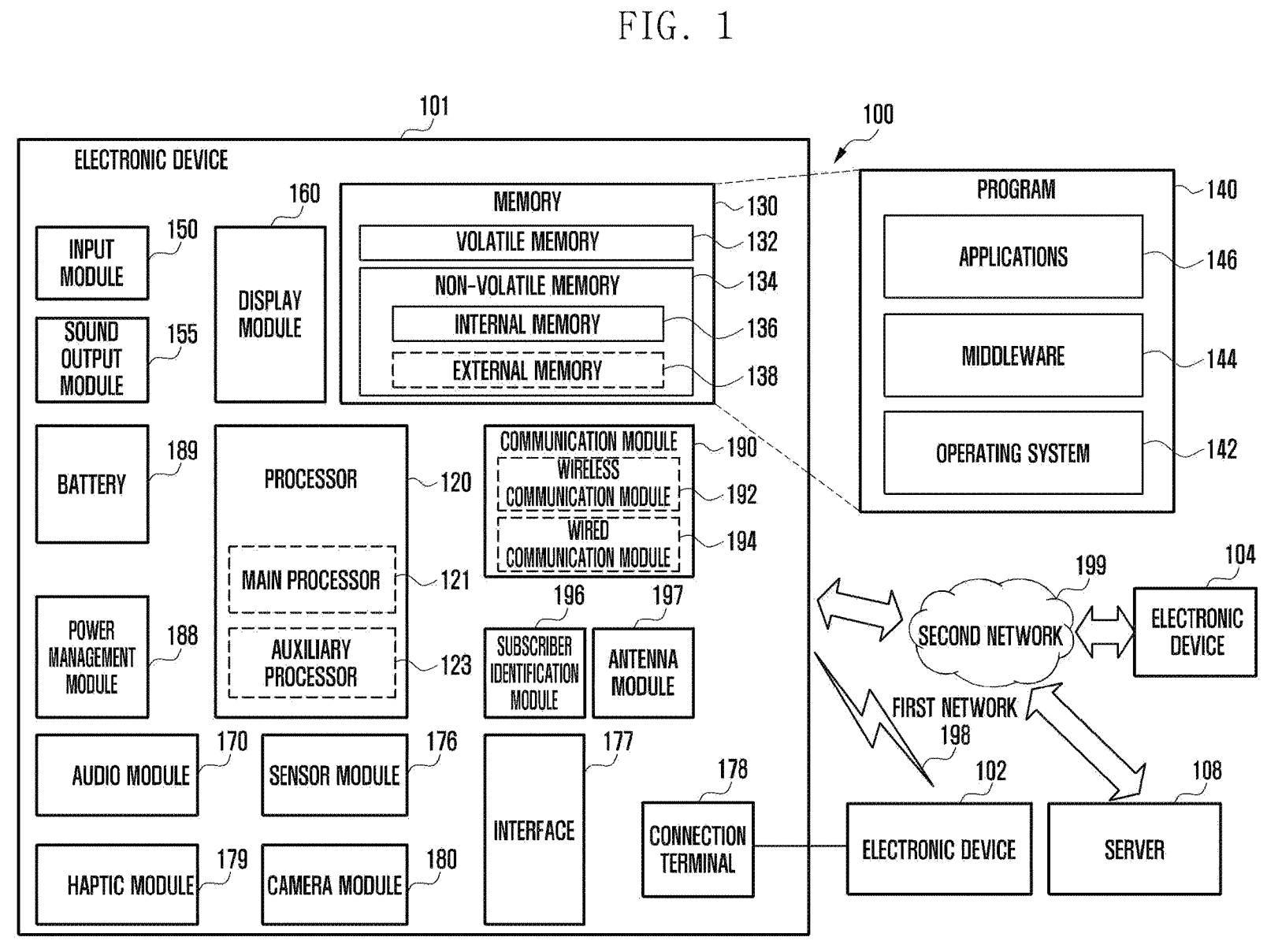

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabit(s) per Second (Gbps) or more) for implementing eMBB, loss coverage (e.g., 164 decibels (dB) or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device

104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

FIG. 2 is an exploded perspective view of the electronic device 101 according to an embodiment of the disclosure.

Figure 3:
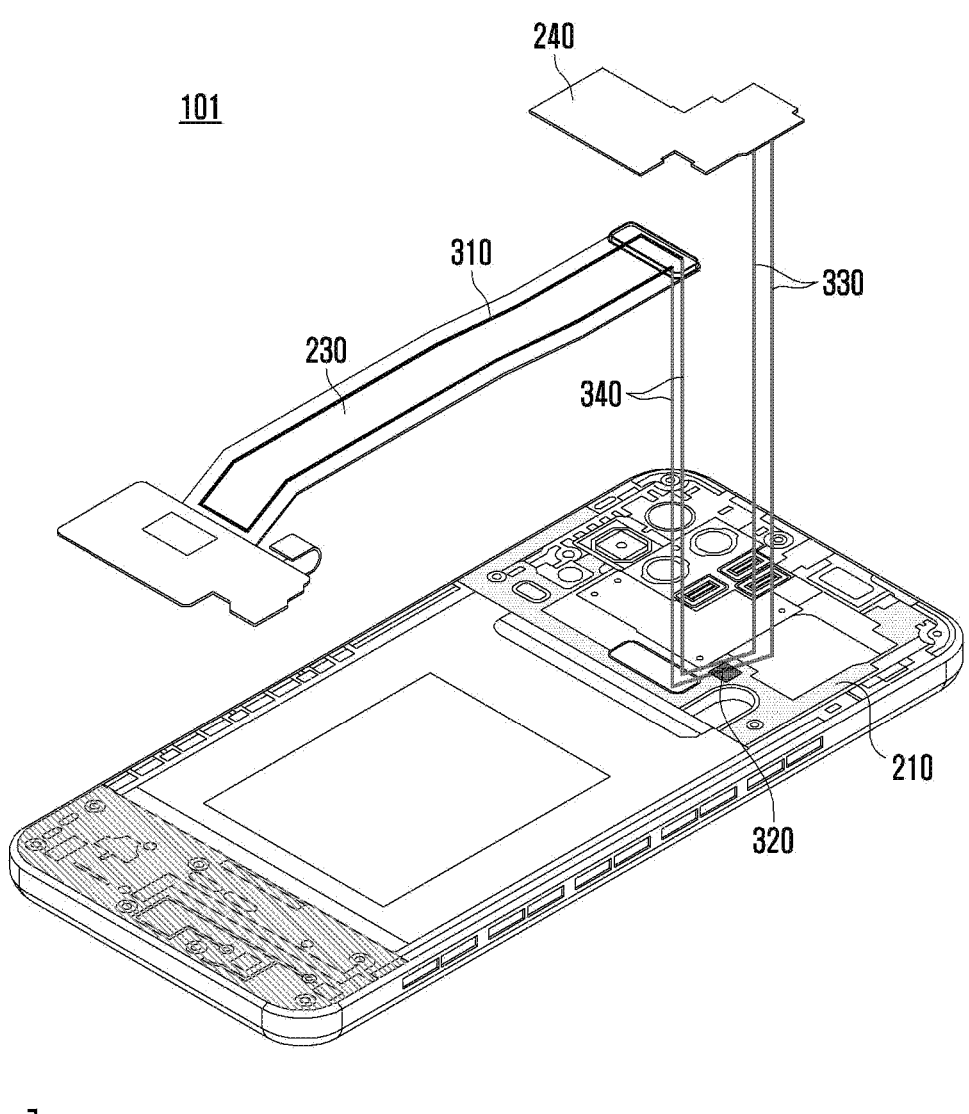
FIG. 3 is an exploded perspective view of an electronic device according to an embodiment of the disclosure.
Figure 3:
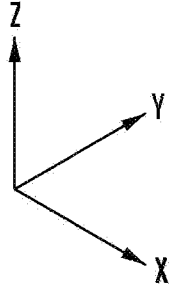

FIG. 3 is an exploded perspective view of the electronic device 101 according to an embodiment of the disclosure.

Figure 4:
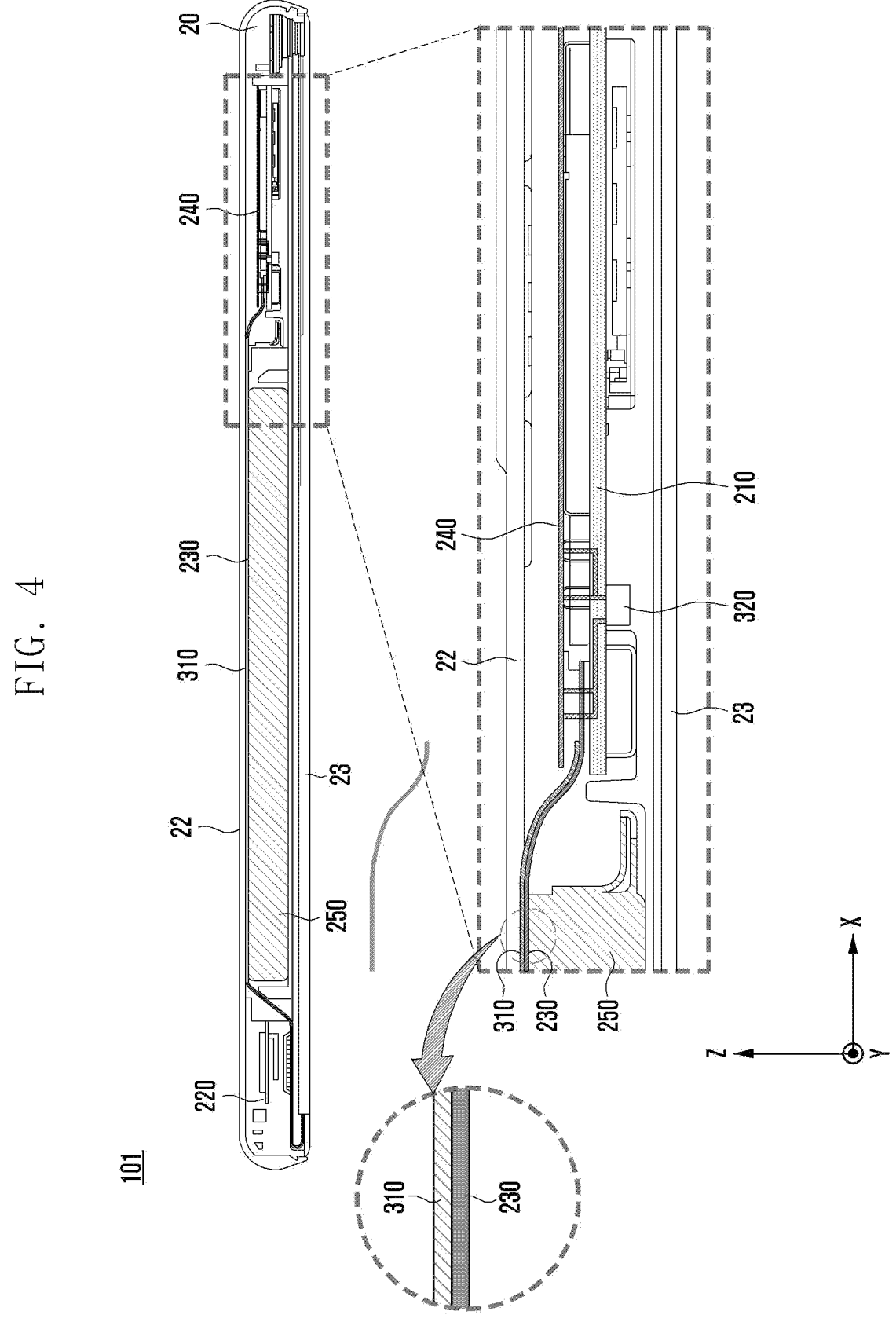
FIG. 4 is a cross-sectional side view of an electronic device according to an embodiment of the disclosure.

FIG. 4 is a cross-sectional side view of the electronic device 101 according to an embodiment of the disclosure.

Unlike the exploded perspective view of FIG. 2, FIG. 3 may be an exploded perspective view in which the components of the electronic device 101 are separated. FIG. 4 may illustrate a cross section corresponding to one of planes parallel to the Z-axis and the Y-axis of the electronic device 101 of FIGS. 2 and 3.

Referring to FIG. 2, the electronic device 101 may include a housing 20. According to an embodiment, the electronic device 101 may include a first plate 21 facing in a first direction (e.g., the opposite direction of the Z-axis) and a second plate 22 facing in a second direction (e.g., the Z-axis direction). According to an embodiment, a display 23 may be exposed to the outside of the housing 20 through a space included in the first plate 21. The housing 20 may refer to, for example, a space formed by coupling the first plate 21 and the second plate 22. According to an embodiment, the components of the electronic device 101, such as a plurality of printed circuit boards (e.g., a first printed circuit board 210, a second printed circuit board 220, and a third printed circuit board 230), may be disposed inside the housing 20. According to an embodiment, the plurality of printed circuit boards (e.g., the first printed circuit board 210, the second printed circuit board 220, and the third printed circuit board 230) may be disposed in a space (e.g., inside the housing 20) between the display 23 and the second plate 22.

According to various embodiments, the electronic device 101 may include the plurality of printed circuit boards (e.g., the first printed circuit board 210, the second printed circuit board 220, and the third printed circuit board 230) inside the housing 20. According to an embodiment, the electronic device 101 may include the plurality of printed circuit boards at least including the first printed circuit board 210, the second printed circuit board 220, and the third printed circuit board 230. According to an embodiment, the plurality of printed circuit boards (e.g., the first printed circuit board 210, the second printed circuit board 220, and the third printed circuit board 230) may be electrically connected to each other. According to various embodiments, the plurality of printed circuit boards (e.g., the first printed circuit board 210, the second printed circuit board 220, and the third printed circuit board 230) may be disposed in each area inside the housing 20. Each area inside the housing 20 may refer to an area on a plane formed by the X-axis and the Y-axis of FIG. 2. For example, the printed circuit boards (e.g., the first printed circuit board 210, the second printed circuit board 220, and the third printed circuit board 230) may have a flat plate shape or a shape similar to a flat plate, and areas in which the printed circuit boards (e.g., the first printed circuit board 210, the second printed circuit board 220, and the third printed circuit board 230) are disposed may be understood as being planar. In addition, each of areas in which the plurality of printed circuit boards (e.g., the first printed circuit board 210, the second printed circuit board 220, and the third printed circuit board 230) are disposed may be understood as corresponding to an area of the second plate 22. According to an embodiment, each area inside the housing 20 may be understood as each area (e.g., a first area and a second area) corresponding to the second plate 22. According to an embodiment, the plurality of printed circuit boards (e.g., the first printed circuit board 210, the second printed circuit board 220, and the third printed circuit board 230) may be arranged to overlap separated different areas (e.g., a first area or a second area). According to an embodiment, the first printed circuit board 210 may be arranged to overlap a first area formed on an upper end (an upper end with reference to the Y-axis direction of FIG. 2) of the second plate 22. According to an embodiment, the second printed circuit board 220 may be disposed to at least include an area (e.g., a second area) spaced apart from the first printed circuit board 210. According to an embodiment, the second printed circuit board 220 may be arranged to overlap an area including at least a part of a second area, which is an area of the second plate 22 excluding the first area. According to an embodiment, the first printed circuit board 210 and the second printed circuit board 220 may be arranged to be separated from each other. According to various embodiments, the third printed circuit board 230 may connect the first printed circuit board 210 and the second printed circuit board 220. According to an embodiment, the third printed circuit board 230 may form a physical and/or electrical connection with the first printed circuit board 210. According to an embodiment, the third printed circuit board 230 may form a physical and/or electrical connection with the second printed circuit board 220. According to an embodiment, the first printed circuit board 210 and the second printed circuit board 220 may be connected to each other through the third printed circuit board 230. According to an embodiment, the third printed circuit board 230 may be arranged to overlap at least a part of the second area.

According to various embodiments, the printed circuit boards (e.g., the first printed circuit board 210, the second printed circuit board 220, and the third printed circuit board 230) may be bases on which various components of the electronic device 101 are stacked. The printed circuit boards (e.g., the first printed circuit board 210, the second printed circuit board 220, and the third printed circuit board 230) may be made of various materials. For example, some of the plurality of printed circuit boards (e.g., the first printed circuit board 210, the second printed circuit board 220, and the third printed circuit board 230) may be made of a flexible material such as polyimide (PI) or polyethylene terephthalate. According to an embodiment, the third printed circuit board 230 may be a flexible printed circuit board (e.g., a flexible printed circuit board (FPCB)) including a flexible material. According to an embodiment, the first printed circuit board 210 and the second printed circuit board 220 may be rigid printed circuit boards (RPCBs).

According to various embodiments, the components of the electronic device 101 may be coupled to the plurality of printed circuit boards (e.g., the first printed circuit board 210, the second printed circuit board 220, and the third printed circuit board 230). According to an embodiment, the components of the electronic device 101 coupled to the printed circuit boards (e.g., the first printed circuit board 210, the second printed circuit board 220, and the third printed circuit board 230) may form an electrical connection with the printed circuit boards.

According to an embodiment, a processor (e.g., the processor 120 of FIG. 1) and/or a memory (e.g., the memory 130 of FIG. 1) may be coupled to the first printed circuit board 210.

The processor (e.g., the processor 120 of FIG. 1) may include, for example, at least one of a central processing unit (e.g., the main processor 121 of FIG. 1), an application processor (e.g., the main processor 121 of FIG. 1), a graphics processing unit (e.g., the auxiliary processor 123 of FIG. 1), an image signal processor (e.g., the auxiliary processor 123 of FIG. 1), a sensor hub processor (e.g., the auxiliary processor 123 of FIG. 1), or a communication processor (e.g., the auxiliary processor 123 of FIG. 1).

The memory (e.g., the memory 130 of FIG. 1) may include, for example, a volatile memory (e.g., the volatile memory 132 of FIG. 1) and/or a non-volatile memory (e.g., the non-volatile memory 134 of FIG. 1).

According to an embodiment, an interface (e.g., the interface 177 and the connection terminal 178 of FIG. 1) and/or a main antenna (not shown) may be mounted on the second printed circuit board 220.

The interface may include, for example, a high definition multimedia interface (HDMI), a universal serial bus (USB) interface, an SD card interface, and/or an audio interface. For example, the interface may electrically or physically connect the electronic device 101 to an external electronic device (e.g., the external electronic device 102 of FIG. 1), and include a USB connector, an SD card/multimedia card (MMC) connector, or an audio connector. The interface may include, for example, an interface port for connection with an external electronic device and an interface integrated circuit (interface IC) which is electrically connected to the interface port and controls the interface port.

According to various embodiments, the electronic device 101 may include a first antenna 240 inside the housing 20. The first antenna 240 may be, for example, a coil antenna. According to various embodiments, the first antenna 240 may be an antenna which supports short-range communication. The first antenna 240 may support short-range wireless communication, for example, near field communication (NFC), wireless charging, and/or magnetic secure transmission (MST) communication. According to an embodiment, the first antenna 240 may be coupled to a printed circuit board (e.g., the first printed circuit board 210).

According to various embodiments, the electronic device 101 may include a battery 250 inside the housing 20. The battery 250 is a device for supplying power to at least one component of the electronic device 101 and may include, for example, a non-rechargeable primary cell, a rechargeable secondary cell, or a fuel cell. For example, at least a part of the battery 250 may be disposed substantially on the same plane as a printed circuit board (e.g., the first printed circuit board 210 and/or the second printed circuit board 220). According to an embodiment, at least a part of the battery 250 may be arranged to overlap at least a part of the third printed circuit board 230. The battery 250 may be integrally disposed inside the electronic device 101 or may be disposed to be detachable from the electronic device 101.

Referring to FIGS. 3 and 4, the third printed circuit board 230 may include a second antenna 310. According to an embodiment, the second antenna 310 may include a conductive pattern. According to an embodiment, the conductive pattern may be printed on the third printed circuit board 230. The conductive pattern may be a pattern made of a conductive material such as copper or an alloy containing copper. For example, the conductive pattern may be printed in a predetermined pattern shape by etching a conductive film attached to a printed circuit board (e.g., the third printed circuit board 230). According to an embodiment, the second antenna 310 may include the conductive pattern printed on the third printed circuit board 230. According to an embodiment, the conductive pattern included in the second antenna 310 may have a loop shape, and may be connected without being disconnected so that a constant current may flow. According to various embodiments, the first antenna 240 may be an antenna which supports short-range communication. The first antenna 240 may support short-range wireless communication, for example, near field communication (NFC), wireless charging, and/or magnetic secure transmission (MST) communication.

Referring to FIG. 3, the second antenna 310 may be connected to the first antenna 240.

Referring to FIG. 3, the electronic device 101 may include a connection circuit (e.g., a first antenna-side connection circuit 330 and a second antenna-side connection circuit 340) and a connection integrated circuit (IC). According to an embodiment, the second antenna 310 and the first antenna 240 may be connected through the connection circuits 330 and 340 and a connection IC 320. According to an embodiment, the first antenna 240 and the second antenna 310 may be electrically connected to electrically form a closed circuit.

Referring to FIG. 4, the conductive pattern included in the second antenna 310 may be printed on one lateral surface in a second direction (the Z-axis direction) of the third printed circuit board 230. According to an embodiment, the second antenna 310 may be disposed on one lateral surface in the second direction of the third printed circuit board 230. Referring to FIG. 4, the third printed circuit board 230 may be disposed so that at least a part of the third printed circuit board 230 is positioned in a space between the battery 250 and the second plate 22, and the conductive pattern may be printed on one lateral surface of the third printed circuit board 230 so as to be positioned in a space between the third printed circuit board 230 and the second plate 22.

Figure 5:
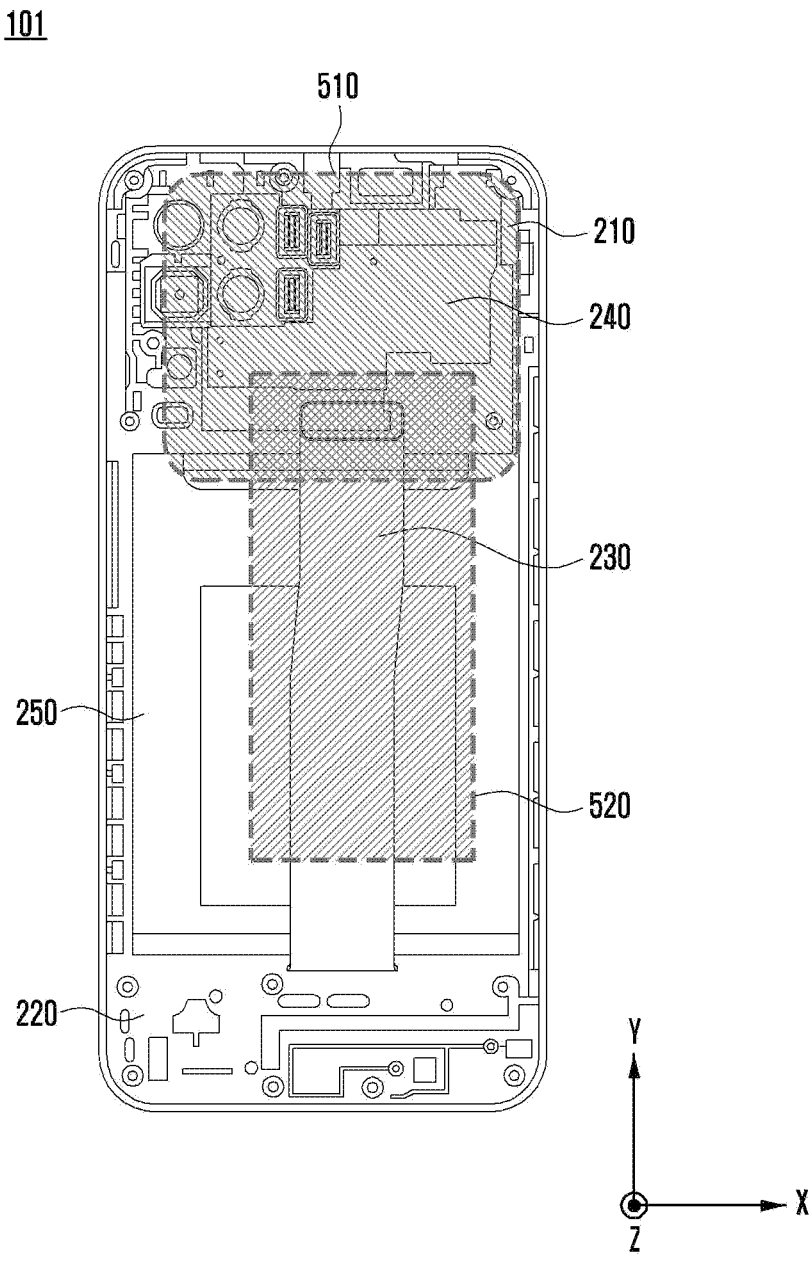
FIG. 5 is a rear view of an electronic device according to an embodiment of the disclosure.

FIG. 5 is a rear view of the electronic device 101 according to an embodiment of the disclosure.

According to various embodiments, the first antenna 240 may support short-range wireless communication. According to various embodiments, the first antenna 240 may be a coil antenna. According to an embodiment, the first antenna 240 may include a conductive coil. According to an embodiment, the first antenna 240 may induce magnetic flux when a current flows through the conductive coil. The magnetic flux induced by the first antenna 240 may be used as, for example, a magnetic signal. According to an embodiment, the magnetic flux induced from the first antenna 240 may be determined by a winding direction of the conductive coil and a direction of the current. According to an embodiment, the first antenna 240 may be configured so that the magnetic flux induced from the first antenna 240 may be formed in a second direction (e.g., the Z-axis direction) or a first direction (e.g., the opposite direction of the Z-axis). That is, the winding direction of the conductive coil included in the first antenna 240 may be formed so that magnetic flux may be generated in the second direction or the first direction.

According to various embodiments, the second antenna 310 may support short-range wireless communication. According to various embodiments, the second antenna 310 may include a conductive pattern. According to an embodiment, the conductive pattern included in the second antenna 310 may include a loop-shaped pattern. According to an embodiment, the conductive pattern included in the second antenna 310 may have a coil shape including a plurality of loop-shaped patterns. According to an embodiment, the second antenna 310 may induce magnetic flux when a current flows through the conductive pattern. The magnetic flux induced by the second antenna 310 may be used as, for example, a magnetic signal. According to an embodiment, the magnetic flux induced from the second antenna 310 may be determined by a direction formed by the loop shape of the conductive pattern and a direction of the current. According to an embodiment, the second antenna 310 may include a shape which allows the magnetic flux induced from the second antenna 310 to be formed in a second direction (e.g., the Z-axis direction) or a first direction (e.g., the opposite direction of the Z-axis). That is, a direction of a loop of the conductive pattern included in the second antenna 310 may be formed so that magnetic flux may be generated in the second direction or the first direction.

Referring to FIG. 5, a range (e.g., a first recognition range 510 and/or a second recognition range 520) of an area in which each of a plurality of antennas (e.g., the first antenna 240 and the second antenna 310) included in the electronic device 101 may recognize a short-range wireless communication signal may be formed. According to various embodiments, each of the first antenna 240 and/or the second antenna 310 may transmit or receive a short-range wireless communication (e.g., NFC communication and/or MST communication) signal. According to an embodiment, a short-range wireless communication signal transmitted and/or received by the first antenna 240 may be recognized at a short distance (e.g., within 0 to 5 cm). According to an embodiment, a range (e.g., the first recognition range 510) of an area in which a signal transmitted and/or received by the first antenna 240 may be recognized by an external electronic device (e.g., the external electronic device 102 of FIG. 1) and/or the first antenna 240 according to characteristics of short-range wireless communication may be formed in a predetermined range (e.g., a range within 0 to 5 cm) with reference to the first antenna 240.

According to an embodiment, a short-range wireless communication signal transmitted and/or received by the second antenna 310 can be recognized at a short distance (e.g., within 0 to 5 cm). According to an embodiment, a range (e.g., the second recognition range 520) of an area in which a signal transmitted and/or received by the second antenna 310 may be recognized by an external electronic device (e.g., the external electronic device 102 of FIG. 1) and/or the second antenna 310 according to characteristics of short-range wireless communication may be formed in a predetermined range (e.g., a range within 0 to 5 cm) with reference to the second antenna 310.

According to various embodiments, a recognition range in which the electronic device 101 may recognize a short-range wireless signal from the outside (e.g., the external electronic device 102 of FIG. 1) and/or a range in which a short-range wireless signal transmitted from the electronic device 101 may be recognized from the outside (e.g., the external electronic device 102 of FIG. 1) may be formed in an area which at least includes a recognition range (e.g., the first recognition range 510) of the first antenna 240 and a recognition range (e.g., the second recognition range 520) of the second antenna 310.

According to various embodiments, the first antenna 240 and the second antenna 310 may induce magnetic flux to each other (mutual induction). According to an embodiment, the first antenna 240 and the second antenna 310 may be configured as a series circuit having one path through which a current flows. For example, the conductive coil included in the first antenna 240 and the conductive pattern included in the second antenna 310 may be electrically connected to each other to form a series-connected closed circuit. According to an embodiment, the magnetic flux induced by the first antenna 240 may induce the second antenna 310, and the magnetic flux induced from the second antenna 310 may induce the first antenna 240, so as to form mutual induction. According to an embodiment, a direction of the magnetic flux induced from the first antenna 240 and/or the second antenna 310 may be determined by a winding direction of the conductive coil included in the first antenna 240, a loop direction of the conductive pattern included in the second antenna 310, and/or a current direction of each antenna (e.g., the first antenna 240 and/or the second antenna 310). According to an embodiment, when the directions of the magnetic fluxes induced by the first antenna 240 and the second antenna 310 are the same, that is, when the mutual induction between the first antenna 240 and the second antenna 310 leads to an aiding connection, the total inductance may be greater than the sum of self-inductance of respective antennas (e.g., the first antenna 240 and the second antenna 310). For example, the self-inductance of the first antenna 240 is L1, the self-inductance of the second antenna 310 is L2, and mutual inductance according to the interaction between the first antenna 240 and the second antenna 310 is M, in the case of the aiding connection, the total inductance may be the same as L1+L2+2M. When the respective antennas (e.g., the first antenna 240 and the second antenna 310) are coupled such that the directions of the induced magnetic fluxes are opposite to each other, for example, the respective antennas are opposing-connected with each other, the total inductance induced by the plurality of antennas (e.g., the first antenna 240 and the second antenna 310) may be L1+L2−2M.

Figure 6:
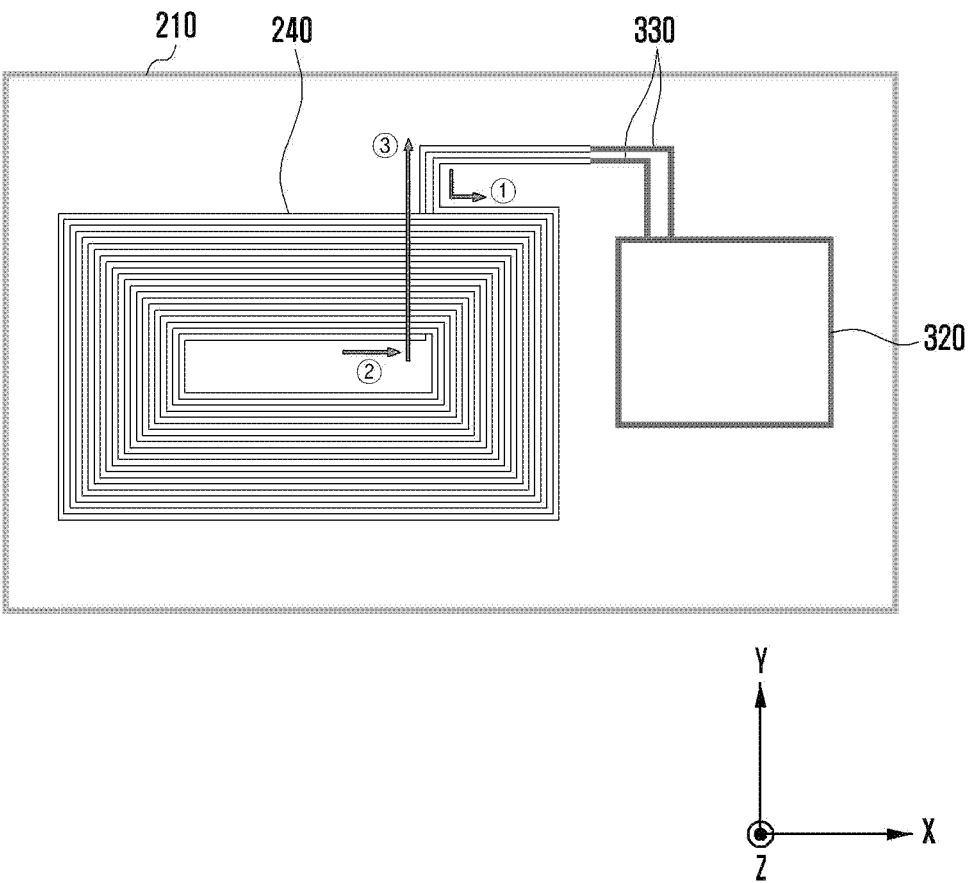
FIG. 6 illustrates a first antenna according to an embodiment of the disclosure.

FIG. 6 illustrates the first antenna 240 according to an embodiment of the disclosure.

According to various embodiments, the first antenna 240 may be an antenna which supports short-range communication. The first antenna 240 may support short-range wireless communication, for example, near field communication (NFC), wireless charging, and/or magnetic secure transmission (MST) communication. According to an embodiment, the first antenna 240 may be coupled to a printed circuit board (e.g., the first printed circuit board 210). According to an embodiment, the first antenna 240 may be connected to a control integrated circuit (IC) 320 through the connection circuit 330. According to an embodiment, the first antenna 240 may receive a current supplied from the control IC 320, and the supplied current may be controlled by the control IC 320.

Referring to FIG. 6, the first antenna 240 may be a coil antenna. According to various embodiments, the first antenna 240 may include a conductive coil including a plurality of loops. According to an embodiment, the conductive coil of the first antenna 240 may include a coil structure wound in a predetermined direction (e.g., a clockwise direction and/or a counterclockwise direction). According to an embodiment, magnetic flux, that is, a magnetic signal, may be emitted to the outside by a current flowing through the conductive coil included in the first antenna 240. According to an embodiment, magnetic flux induced from the first antenna 240 may be determined by a winding direction of the conductive coil and a direction of the current. According to an embodiment, the first antenna 240 may be configured so that the magnetic flux induced from the first antenna 240 may be formed in a second direction (e.g., the Z-axis direction) or a first direction (e.g., the opposite direction of the Z-axis). That is, the winding direction of the conductive coil included in the first antenna

240 may be formed so that magnetic flux may be generated in the second direction or the first direction.

Figure 7:
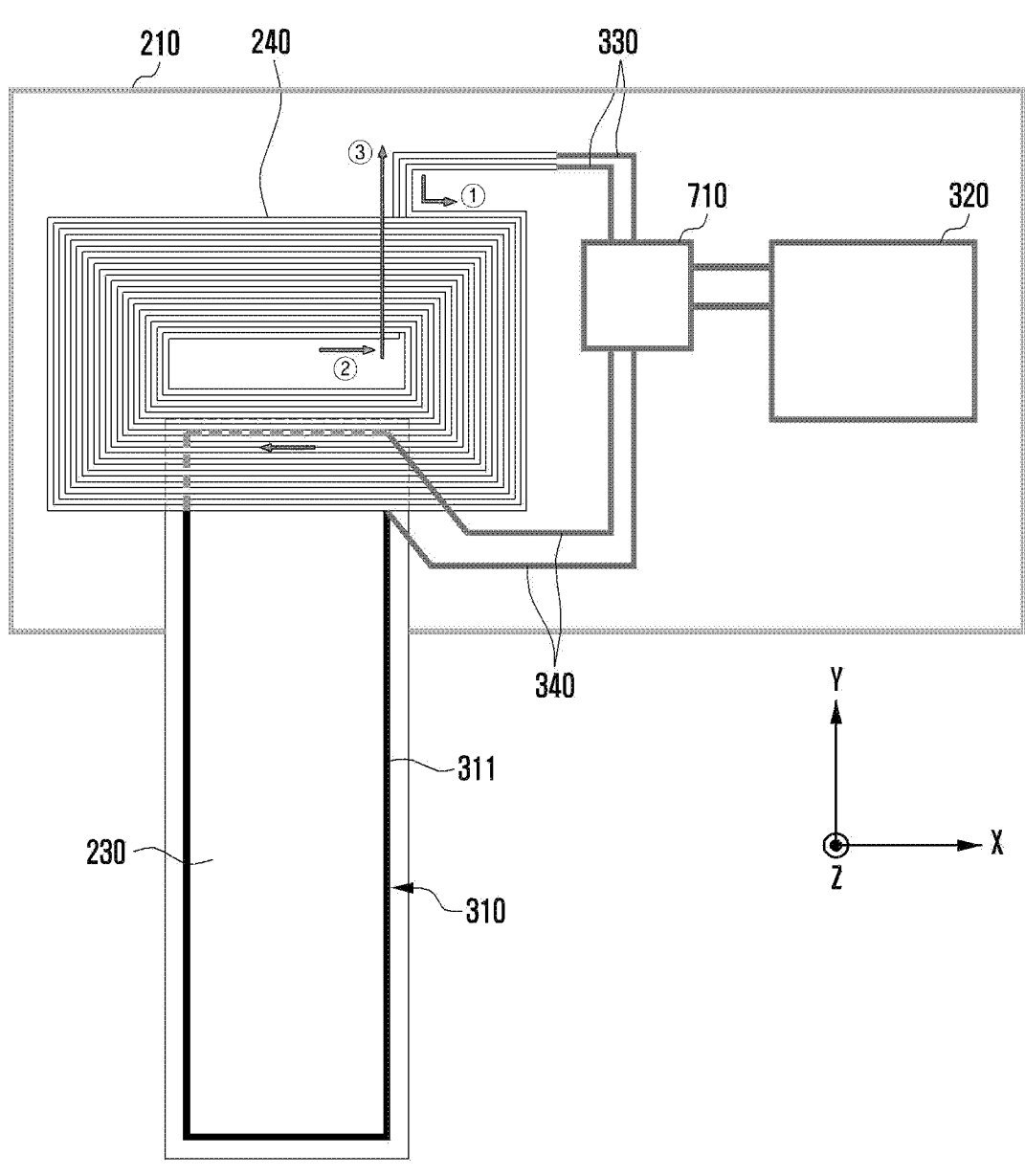
FIG. 7 illustrates a first antenna and a second antenna according to an embodiment of the disclosure.

FIG. 7 illustrates a first antenna and a second antenna according to an embodiment of the disclosure.

Figure 8:
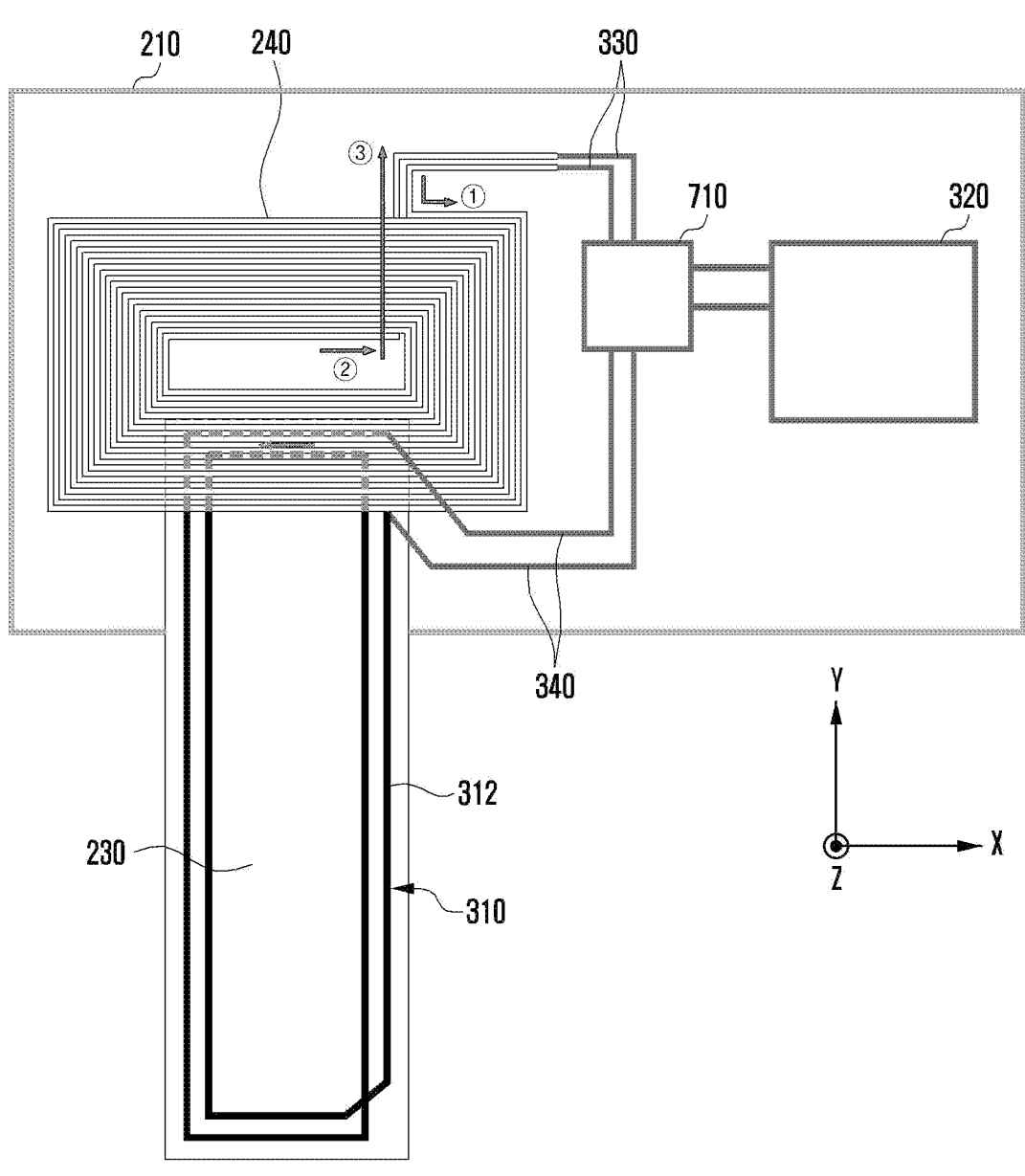
FIG. 8 illustrates a second antenna to which a pattern is added according to an embodiment of the disclosure.

FIG. 8 illustrates a second antenna to which a pattern is added according to an embodiment of the disclosure.

Figure 9:
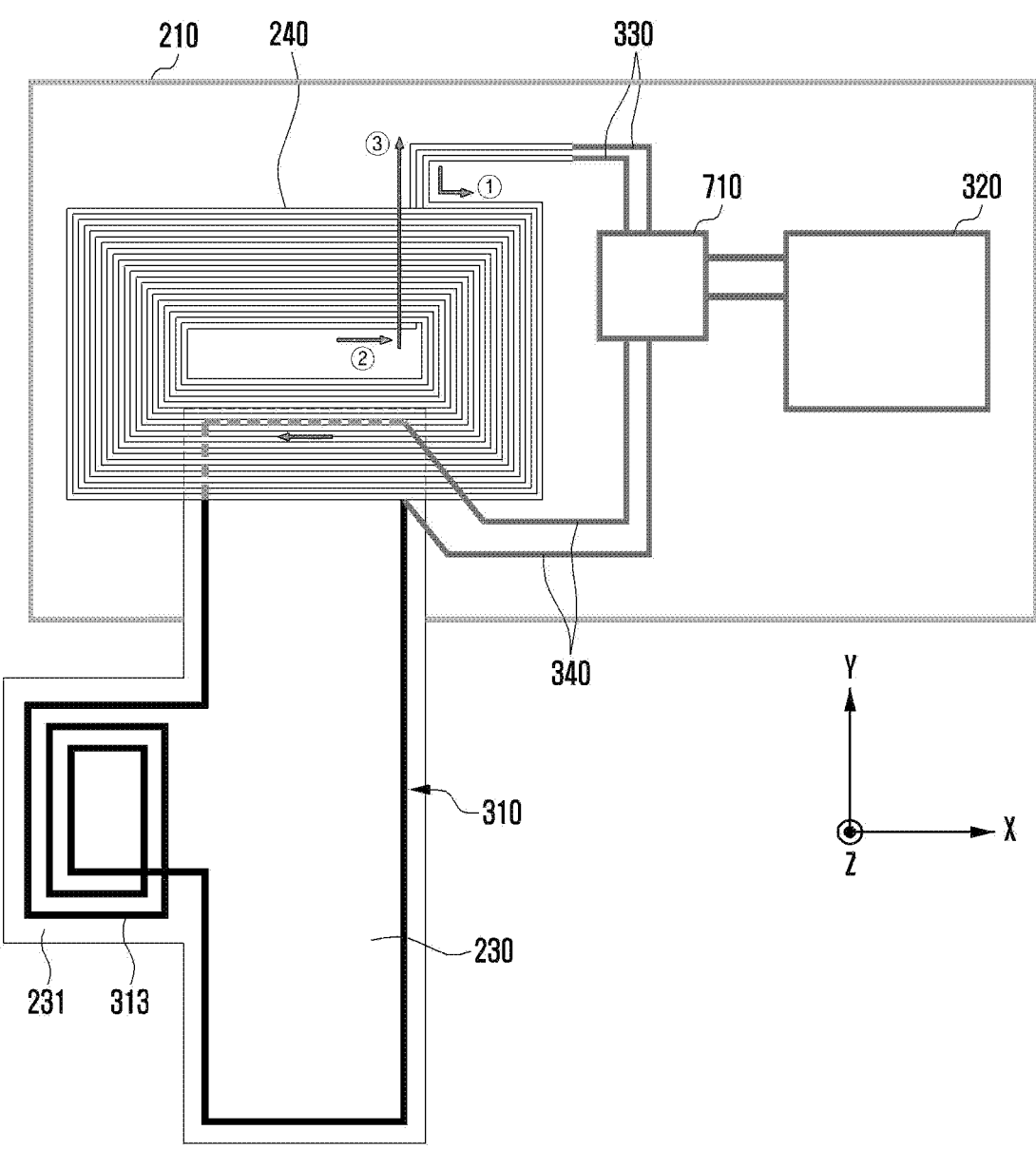
FIG. 9 illustrates an extended third printed circuit board according to an embodiment of the disclosure.

FIG. 9 illustrates an extended third printed circuit board according to an embodiment of the disclosure.

Referring to FIGS. 7, 8, and 9, the third printed circuit board 230 may be electrically connected to the first printed circuit board 210. According to various embodiments, the third printed circuit board 230 may include the second antenna 310. According to various embodiments, the first antenna 240 may be an antenna which supports short-range communication. The first antenna 240 may support short-range wireless communication, for example, near field communication (NFC), wireless charging, and/or magnetic secure transmission (MST) communication.

Referring to FIGS. 7, 8, and 9, the second antenna 310 may be connected to the first antenna 240. According to an embodiment, the second antenna 310 and the first antenna 240 may be connected through the connection circuits 330 and 340 and the connection IC 710. According to an embodiment, the first antenna 240 and the second antenna 310 may be electrically connected to electrically form a series closed circuit.

According to various embodiments, the second antenna 310 may include a conductive pattern. According to an embodiment, the conductive pattern may be printed on the third printed circuit board 230. The conductive pattern may be a pattern made of a conductive material such as copper or an alloy containing copper. For example, the conductive pattern may be printed in a predetermined pattern shape by etching a conductive film attached to a printed circuit board (e.g., the third printed circuit board 230). According to an embodiment, the second antenna 310 may include the conductive pattern printed on the third printed circuit board 230. According to an embodiment, the conductive pattern included in the second antenna 310 may have a loop shape, and may be connected without being disconnected so that a constant current may flow.

According to various embodiments, a current flowing through the conductive pattern included in the second antenna 310 may induce magnetic flux to generate a magnetic signal. According to various embodiments, the conductive pattern may have a loop shape. Referring to FIG. 7, the second antenna 310 may include a conductive pattern 311 having a loop shape. According to various embodiments, the second antenna 310 may include a conductive pattern having a coil shape. Referring to FIG. 8, the coil shape may be a shape including a plurality of loops. According to an embodiment, the second antenna 310 may include a conductive pattern 312 having a coil shape including a plurality of loops. According to an embodiment, the second antenna 310 may operate as a coil antenna. According to various embodiments, the conductive pattern having the coil shape including the plurality of loop shapes may have self-inductance increased in proportion to the number of loop shapes.

According to various embodiments, the third printed circuit board 230 may further include an extension area 231 extended by a predetermined area. According to various embodiments, the third printed circuit board 230 may include the extension area 231 extending within a range not exceeding a second plate (e.g., the second plate 22 of FIG. 2). According to an embodiment, the extension area 231 may be disposed in an area which does not overlap the first antenna 240. According to an embodiment, the extension area 231 may be disposed in an area which does not overlap the first printed circuit board 210, for example, in at least a part of a second area other than a first area which is an area of the second plate 22 on which the first printed circuit board is disposed. According to an embodiment, an additional conductive pattern 313 may be printed on the extension area 231. According to an embodiment, the second antenna 310 may include the additional conductive pattern 313. According to an embodiment, the additional conductive pattern 313 may have a coil shape. According to an embodiment, the additional conductive pattern 313 may be coupled with the conductive pattern (e.g., the conductive pattern 311 of FIG. 7 or the conductive pattern 312 of FIG. 8) of the second antenna 310 to configure one coil. According to an embodiment, a signal recognition range (e.g., the second recognition range 520 of FIG. 5) of the second antenna 310 may be extended by an area at least including an area corresponding to the additional conductive pattern 313 or an area corresponding to the extension area 231. According to an embodiment, when the additional conductive pattern 313 is included, the conductive pattern included in the second antenna 310 may have enlarged self-inductance.

Referring to FIGS. 7, 8, and 9, the first antenna 240 and the second antenna 310 may induce magnetic flux to each other (mutual induction). According to an embodiment, the first antenna 240 and the second antenna 310 may be configured as a series circuit having one path through which a current flows. For example, the conductive coil included in the first antenna 240 and the conductive pattern included in the second antenna 310 may be electrically connected to each other to form a series-connected closed circuit. According to an embodiment, the magnetic flux induced by the first antenna 240 may induce the second antenna 310, and the magnetic flux induced from the second antenna 310 may induce the first antenna 240, so as to form mutual induction. According to an embodiment, a direction of the magnetic flux induced from the first antenna 240 and/or the second antenna 310 may be determined by a winding direction of the conductive coil included in the first antenna 240, a loop direction of the conductive pattern included in the second antenna 310, and/or a current direction of each antenna (e.g., the first antenna 240 and/or the second antenna 310). According to an embodiment, when the directions of the magnetic fluxes induced by the first antenna 240 and the second antenna 310 are the same, that is, when the mutual induction between the first antenna 240 and the second antenna 310 leads to an aiding connection, the total inductance may be greater than the sum of self-inductance of respective antennas (e.g., the first antenna 240 and the second antenna 310). For example, the self-inductance of the first antenna 240 is L1, the self-inductance of the second antenna 310 is L2, and mutual inductance according to the interaction between the first antenna 240 and the second antenna 310 is M, in the case of the aiding connection, the total inductance may be the same as L1+L2+2M. When the respective antennas (e.g., the first antenna 240 and the second antenna 310) are coupled such that the directions of the induced magnetic fluxes are opposite to each other, for example, the respective antennas are opposing-connected with each other, the total inductance induced by a plurality of antennas (e.g., the first antenna 240 and the second antenna 310) may be L1+L2−2M.

Figure 10:
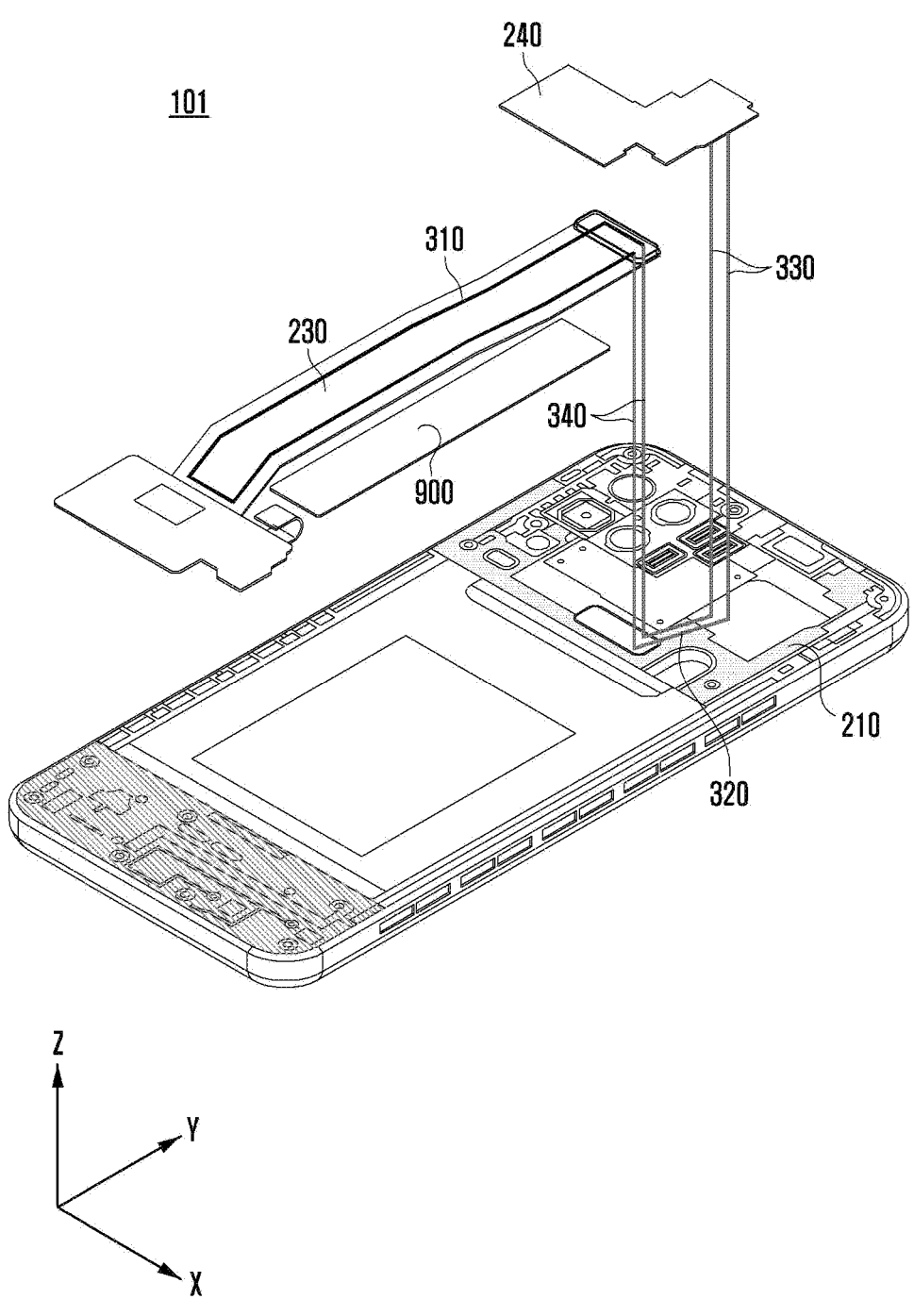
FIG. 10 is an exploded perspective view of an electronic device including a ferromagnetic member according to an embodiment of the disclosure.

FIG. 10 is an exploded perspective view of an electronic device including a ferromagnetic member according to an embodiment of the disclosure.

Figure 11:
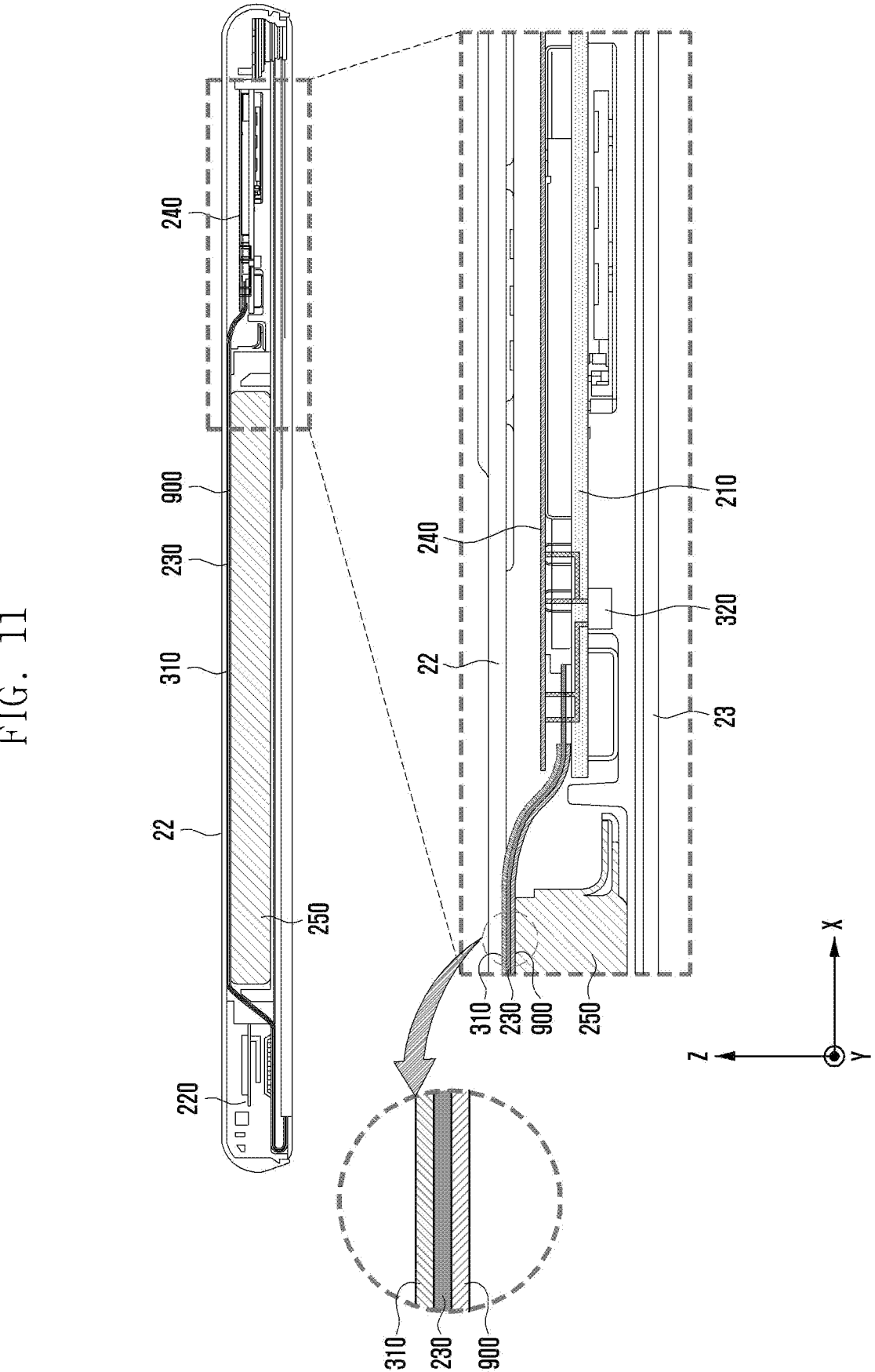
FIG. 11 is a cross-sectional side view of an electronic device including a ferromagnetic member according to an embodiment of the disclosure.

FIG. 11 is a cross-sectional side view of an electronic device including a ferromagnetic member according to an embodiment of the disclosure.

Referring to FIGS. 10 and 11, the electronic device 101 may include a ferromagnetic member 900. According to various embodiments, the ferromagnetic member 900 may include a ferromagnetic substance material having high relative permeability. According to an embodiment, the ferromagnetic member 900 may be made of a ferromagnetic substance material, for example, mu-metal (e.g., permalloy, silicon metal, or Fe+Ni) or ferrite. The ferromagnetic member 900 may be made of soft ferrite. The ferromagnetic member 900 may be configured by a combination of a ferromagnetic substance and soft ferrite. According to an embodiment, the ferromagnetic member 900 may induce a direction of magnetic flux generated by the second antenna 310. According to an embodiment, the ferromagnetic member 900 may be disposed at a lower end of the third printed circuit board 230. According to an embodiment, the ferromagnetic member 900 may be attached to one surface in a first direction (e.g., the opposite direction of the Z axis) of the third printed circuit board 230. According to an embodiment, the ferromagnetic member 900 may have a plate-like shape. According to an embodiment, the ferromagnetic member 900 may be disposed on a lateral surface opposite to the second antenna 310 with reference to the third printed circuit board 230. According to an embodiment, the ferromagnetic member 900 may be coupled to the third printed circuit board 230 while being insulated from the third printed circuit board 230. According to an embodiment, the ferromagnetic member 900 may include a plate, sheet, or thin-film foil shape.

An electronic device according to various embodiments disclosed herein may include a housing which includes a first plate facing a first direction and a second plate facing a second direction opposite to the first direction, and forms a space between the first plate and the second plate, a display disposed inside the housing and exposed through the first plate, a first printed circuit board disposed between the display and the second plate, a second printed circuit board disposed between the display and the second plate, a third printed circuit board which is disposed between the display and the second plate and electrically connects the first printed circuit board and the second printed circuit board, and a first antenna coupled to the first printed circuit board, wherein the third printed circuit board includes a second antenna electrically connected to the first antenna.

In addition, the second antenna may include a conductive pattern formed on the third printed circuit board.

In addition, the first antenna and the second antenna may be aiding-connected to each other.

In addition, the conductive pattern may have a loop shape.

In addition, the conductive pattern may have a coil shape including a plurality of loops.

In addition, the pattern having the loop shape may be formed in a direction in which the first antenna and the second antenna are aiding-connected to each other.

In addition, the second antenna may be electrically connected to the first antenna to form a closed circuit.

In addition, the third printed circuit board may be arranged to overlap at least a part of a second area of the second plate excluding a first area on which the first printed circuit board is disposed among areas of the second plate.

In addition, the second antenna may be arranged to overlap at least a part of the second area.

In addition, the third printed circuit board may be a flexible printed circuit board (FPCB).

In addition, the electronic device may further include a ferromagnetic member for inducing magnetic flux to the second antenna.

In addition, the ferromagnetic member may be attached to a lateral surface in the first direction of the third printed circuit board.

In addition, the ferromagnetic member may include a mu-metal, permalloy, and/or ferrite material.

In addition, the third printed circuit board may include an extension area extending in a direction in which the third printed circuit board does not overlap the first printed circuit board, and may include an additional conductive pattern printed on the extension area, electrically connected to the second antenna, and having a coil shape.

In addition, the first antenna may be a coil antenna including a plurality of loops.

In addition, the electronic device may further include a processor, a memory, and an integrated circuit coupled to the first printed circuit board, and the integrated circuit may be electrically connected to the first antenna and the second antenna.

In addition, the electronic device may further include an interface port coupled to the second printed circuit board in order for connection with an external electronic device, and an interface integrated circuit (IC) electrically connectable to the interface port.

In addition, the second antenna may support near field communication (NFC) communication.

In addition, the second antenna may support magnetic secure transmission (MST) communication.

In addition, the first antenna may support near field communication (NFC) communication and/or magnetic secure transmission (MST) communication.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing which comprises a first plate facing a first direction and a second plate facing a second direction opposite to the first direction, and forms a space between the first plate and the second plate;
   a display disposed inside the housing and exposed through the first plate;
   a first printed circuit board disposed between the display and the second plate and arranged to overlap an area formed on an upper end of the second plate;
   a second printed circuit board disposed between the display and the second plate and separated from the first printed circuit board;
   a battery disposed substantially on a same plane with the first printed circuit board and the second printed circuit board;
   a third printed circuit board disposed between the battery and the second plate; and
   a first antenna coupled to the first printed circuit board,
   wherein the third printed circuit board comprises a second antenna disposed between the battery and the second plate electrically connected to the first antenna.

2. The electronic device of claim 1, wherein the second antenna comprises a conductive pattern formed on the third printed circuit board.

3. The electronic device of claim 2, wherein the conductive pattern has a loop shape.

4. The electronic device of claim 3, wherein the conductive pattern has a coil shape including a plurality of loops.

5. The electronic device of claim 3, wherein the conductive pattern having the loop shape is formed in a direction in which the first antenna and the second antenna are aiding-connected to each other.

6. The electronic device of claim 1, wherein the first antenna and the second antenna are aiding-connected to each other.

7. The electronic device of claim 1, wherein the second antenna is electrically connected to the first antenna to form a closed circuit.

8. The electronic device of claim 1, wherein the third printed circuit board is arranged to overlap at least a part of a second area of the second plate excluding a first area on which the first printed circuit board is disposed among areas of the second plate.

9. The electronic device of claim 8, wherein the second antenna is arranged to overlap at least a part of the second area.

10. The electronic device of claim 1, wherein the third printed circuit board is a flexible printed circuit board (FPCB).

11. The electronic device of claim 1, further comprising:
    a ferromagnetic member for inducing magnetic flux to the second antenna.

12. The electronic device of claim 11, wherein the ferromagnetic member is attached to a lateral surface in the first direction of the third printed circuit board.

13. The electronic device of claim 11, wherein the ferromagnetic member comprises at least one of a mu-metal, permalloy, or ferrite material.

14. The electronic device of claim 1, wherein the third printed circuit board comprises:
    an extension area extending in a direction in which the third printed circuit board does not overlap the first printed circuit board; and
    an additional conductive pattern printed on the extension area, electrically connected to the second antenna, and having a coil shape.

15. The electronic device of claim 1, wherein the first antenna is a coil antenna comprising a plurality of loops.

16. The electronic device of claim 1, further comprising:
    a processor, a memory and an integrated circuit coupled to the first printed circuit board,
    wherein the integrated circuit is electrically connected to the first antenna and the second antenna.

17. The electronic device of claim 1, further comprising:
    an interface port coupled to the second printed circuit board in order for connection with an external electronic device, and
    an interface integrated circuit (IC) electrically connectable to the interface port.

18. The electronic device of claim 1, wherein the second antenna supports near field communication (NFC) communication.

19. The electronic device of claim 1, wherein the second antenna supports magnetic secure transmission (MST) communication.

20. The electronic device of claim 1, wherein the first antenna supports at least one of near field communication (NFC) communication, or magnetic secure transmission (MST) communication.

* * * * *